(12) United States Patent
Prejbeanu

(10) Patent No.: US 8,885,397 B2
(45) Date of Patent: Nov. 11, 2014

(54) SELF-REFERENCED MRAM CELL WITH OPTIMIZED RELIABILITY

(71) Applicant: Crocus Technology SA, Grenoble Cedex (FR)

(72) Inventor: Ioan Lucian Prejbeanu, Seyssinet Pariset (FR)

(73) Assignee: Crocus Technology SA, Grenoble (FR)

( * ) Notice: Subject to any disclaimer, the term of this patent is extended or adjusted under 35 U.S.C. 154(b) by 212 days.

(21) Appl. No.: 13/683,239

(22) Filed: Nov. 21, 2012

(65) Prior Publication Data

US 2013/0128659 A1  May 23, 2013

(30) Foreign Application Priority Data

Nov. 22, 2011 (EP) ..................... 11290533

(51) Int. Cl.
| | |
|---|---|
| *G11C 11/00* | (2006.01) |
| *G11C 11/16* | (2006.01) |
| *H01F 10/32* | (2006.01) |
| *H01L 43/08* | (2006.01) |
| *H01L 43/12* | (2006.01) |

(52) U.S. Cl.
CPC .......... *G11C 11/161* (2013.01); *H01F 10/3263* (2013.01); *G11C 11/1675* (2013.01); *H01L 43/08* (2013.01); *H01L 43/12* (2013.01); *H01F 10/3254* (2013.01); *G11C 11/1673* (2013.01)
USPC ............................ 365/158; 365/171; 365/173

(58) Field of Classification Search
CPC ..... G11C 11/16; G11C 11/15; G11C 11/5607
USPC .......................... 365/158, 171, 173
See application file for complete search history.

(56) References Cited

U.S. PATENT DOCUMENTS

| | | | |
|---|---|---|---|
| 5,869,963 | A | 2/1999 | Saito et al. |
| 7,796,428 | B2 | 9/2010 | Redon |
| 8,406,041 | B2 * | 3/2013 | Shukh ........................... 365/158 |
| 2005/0180202 | A1 | 8/2005 | Huai et al. |
| 2006/0102969 | A1 | 5/2006 | Huai et al. |

FOREIGN PATENT DOCUMENTS

EP  2276034 A2  1/2011

OTHER PUBLICATIONS

Extended European Search Report dated Apr. 12, 2012 for Application No. EP11290533.6.
Wang et al.:"Low-Current Blocking Temperature Writing of Double Barrier Magnetic Random Access Memory Cells", Applied Physics Letters, AIP, American Institute of Physics, Melville, NY, US, vol. 84, No. 6.

* cited by examiner

*Primary Examiner* — Son Dinh
*Assistant Examiner* — Nam Nguyen
(74) *Attorney, Agent, or Firm* — Pearne & Gordon LLP

(57) ABSTRACT

Magnetic random access memory (MRAM) element suitable for a thermally-assisted write operation and for a self-referenced read operation, including a magnetic tunnel junction portion having a first portion and a second portion, each portion including a storage layer, a sense layer, and a tunnel barrier layer; the magnetic tunnel junction further including an antiferromagnetic layer between the two storage layers and pinning a storage magnetization of each of the storage layers below a critical temperature, and freeing them at and above the critical temperature; such that, during a write operation, a free magnetization of each of the sense layer is magnetically saturable according to a direction of a write magnetic field when applied; and the storage magnetizations are switchable in a direction substantially parallel and corresponding to the direction of the saturated free magnetizations.

9 Claims, 1 Drawing Sheet

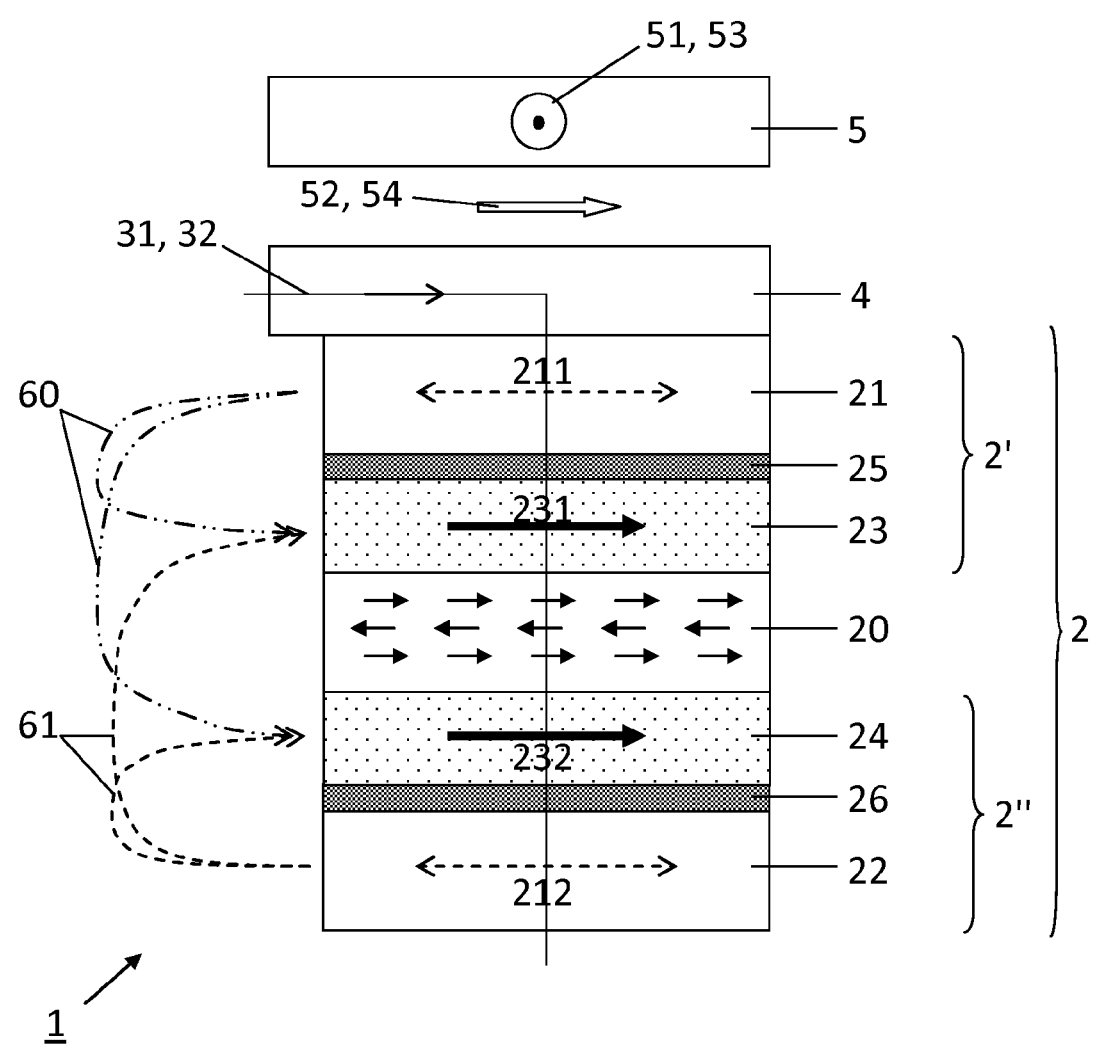

SELF-REFERENCED MRAM CELL WITH OPTIMIZED RELIABILITY

FIELD

The present invention concerns a random access memory (MRAM) element suitable for a thermally-assisted write operation and for a self-referenced read operation that can be reliably written at higher temperatures relative to conventional MRAM cells.

BACKGROUND

Magnetic random access memory (MRAM) cells using the so-called self-referenced reading operation typically comprise a magnetic tunnel junction formed of a magnetic storage layer having a magnetization which direction can be changed from a first stable direction to a second stable direction, a thin insulating layer, and a sense layer with a magnetization having a reversible direction. Self-referenced MRAM cells allows for performing the write and read operation with low power consumption and an increased speed. The self-referenced reading operation is described in European patent application EP 2276034 by the same applicant. It typically comprises as double sampling wherein the direction of sense layer magnetization is aligned in a first and second directions and the respective resistance of the magnetic tunnel junction is measured for each direction.

Self-referenced MRAM cells can be advantageously used in MRAM-based CAM, non-volatile cells for security applications including user privilege, security or encryption information on a packet-by-packet basis for high-performance data switches, firewalls, bridges, and routers. Self-referenced MRAM cells are also useful for making functional memories with a reduced yield as well as for high temperature applications.

In the case of high temperature applications, a current pulse is passed through the magnetic tunnel junction in order to heat the MRAM cell to the high temperature. This current pulse is liable to subject the thin insulating layer to a considerable electric stress. The voltage applied through the magnetic tunnel junction could possibly reach or even exceed the breakdown voltage of such insulating layer. Even if the voltage applied across the insulating layer is lower than its breakdown voltage, the stress linked to the electric current pulse can result in considerable ageing effects in the long term, notably after a great number of voltage cycles, for example during writing cycles.

SUMMARY

The present disclosure concerns a magnetic random access memory (MRAM) element suitable for a thermally-assisted (TA) write operation and for a self-referenced read operation, comprising a magnetic tunnel junction portion having a first portion comprising: a first storage layer having a first storage magnetization; a first sense layer having a first free magnetization; and a first tunnel barrier layer between the first storage layer and the first sense layer; and a second portion, comprising: a second storage layer having a first storage magnetization; a second sense layer having a second free magnetization; and a second tunnel barrier layer between the second storage layer and the second sense layer; the magnetic tunnel junction portion further comprising an antiferromagnetic layer comprised between the first and second storage layers and pinning the first and second storage magnetizations at a low temperature threshold, and freeing the first and second storage magnetizations at a high temperature threshold; wherein during a write operation, the first and second free magnetization are magnetically saturable according to a direction of a write magnetic field when the write magnetic field is applied; and wherein the first and second storage magnetization are switchable in a direction substantially parallel and corresponding to the direction of the saturated first and second free magnetizations.

In an embodiment, the MRAM element can be further configured such that the first magnetic tunnel junction portion has a first resistance-area product that is substantially equal to a second resistance-area product of the second magnetic tunnel junction portion, such that a magnetoresistance ratio of the MRAM element remains substantially unchanged during the write operation.

The present disclosure further pertains to a method for writing to the MRAM element using the TA write operation, comprising:

heating the magnetic tunnel junction at the high temperature threshold;

switching the first and second storage magnetizations; and cooling the MRAM element below the critical temperature such as to freeze the first and second storage magnetizations in their written state; wherein the first and second storage magnetizations are switched substantially simultaneously in a direction substantially parallel to each other. Said switching can comprise applying a write magnetic field such as to magnetically saturate the first and second free magnetization according to a direction of the write magnetic field; and the first and second storage magnetizations can be switched substantially simultaneously in a direction substantially parallel to each other.

The configuration of the disclosed MRAM element with the magnetic tunnel junction comprising the first and second tunnel barrier layers allows for reducing the voltage applied on the first and second tunnel barrier layers when the magnetic tunnel junction is heated the high temperature threshold, compared to a magnetic tunnel junction comprising only one barrier layer. The magnetic tunnel junction of the disclosed MRAM element can thus be heated effectively while minimizing risks of breakdown and ageing of the tunnel barrier layers.

BRIEF DESCRIPTION OF THE DRAWINGS

The invention will be better understood with the aid of the description of an embodiment given by way of example and illustrated by FIG. 1 illustrating a random access memory element according to an embodiment.

DETAILED DESCRIPTION OF POSSIBLE EMBODIMENTS

FIG. 1 illustrates a random access memory (MRAM) element 1 according to an embodiment. The MRAM element 1 comprises a magnetic tunnel junction 2 having a first portion 2' comprising a first storage layer 23 having a first storage magnetization 231; a first sense layer 21 having a first free magnetization 211; and a first tunnel barrier layer 25 between the first storage layer 23 and the first sense layer 21. The magnetic tunnel junction 2 further comprises a second portion 2" comprising a second storage layer 24 having a second storage magnetization 232; a second sense layer 22 having a second free magnetization 212; and a second tunnel barrier layer 26 between the second storage layer 24 and the second sense layer 22. The magnetic tunnel junction 2 further comprises an antiferromagnetic layer 20 comprised between the first and second storage layers 23, 24 and pinning the first and second storage magnetizations 231, 232 at a low temperature threshold, below a critical temperature of the antiferromagnetic layer 20, and freeing the first and second storage magnetizations 231, 232 at a high temperature threshold, at and above the critical temperature.

In an embodiment, a thermally-assisted (TA) write operation of the MRAM element 1 can comprise the step of:

heating the magnetic tunnel junction 2 to the high temperature threshold;

switching the first and second storage magnetizations 231, 232; and;

cooling the magnetic tunnel junction 2 at the low temperature threshold, such as to freeze the first and second storage magnetizations 231, 232 in their written state.

The configuration of the magnetic tunnel junction 2, where the first and second storage layers 23, 24 are symmetrically arranged on each side of the antiferromagnetic layer 20 results in that the first storage magnetization 231 is switched substantially simultaneously and in a direction substantially parallel to the second storage magnetization 232.

In an embodiment, the MRAM element 1 further comprises a field line 5 in communication with the magnetic tunnel junction 2. The field line 5 is arranged for passing a field current 51 adapted to generate a write magnetic field 52 that is able to switch the first and second storage magnetizations 231, 232 along a direction that is substantially perpendicular with the field line 5. Heating the MRAM element 1 can be performed by passing a heating current 31 in the magnetic tunnel junction 2 via a current line 4 in electrical communication with the magnetic tunnel junction 2 (see FIG. 1). Alternatively, the current line 4 could be also used for passing the field current 51 destined to generate the write magnetic field 52. Once the magnetic tunnel junction 2 has been cooled to the low temperature threshold, the storage magnetization 231 becomes pinned in the switched, or written, orientation in accordance with the orientation of the write magnetic field 52.

The first and second storage layers 23, 24 are configured such as to have a magnetic anisotropy being oriented in a direction being substantially perpendicular with the field line 5 such that the first and second storage magnetizations 231, 232 are switched substantially simultaneously and substantially in the same direction by applying the write magnetic field 52.

In another embodiment, switching the first and second storage magnetizations 231, 232 is performed by applying the magnetic field 52 with a magnitude such as to saturate the first free magnetization 211 in a direction according to the direction of the write magnetic field 52. The saturated first free magnetization 211 induces in turn a first local magnetic stray field 60 coupling the first storage magnetization 231 in a closed magnetic flux configuration such as to orient the first storage magnetization 231 in the direction of the saturated first free magnetization 211. The magnetic field 52 is also arranged such as to saturate the second sense magnetization 212 in the direction of the write magnetic field 52. The saturated second sense magnetization 212 induces a second local magnetic stray field 61 magnetically coupling the second free magnetization 212 with the storage magnetization 232 in a closed magnetic flux configuration such as to orient the second storage magnetization 232 in the direction of the saturated second free magnetization 212. In FIG. 1, the first and second local magnetic stray fields 60, 61 are represented orienting the first and second storage magnetization toward the right. Since both first and second local magnetic stray fields 60, 61 are oriented in the same direction, the first local magnetic stray field 60 also orients the second storage magnetization 232 in the direction of the saturated first free magnetization 211 and the second local magnetic stray field 61 orients the first storage magnetization 231 in the direction of the saturated second free magnetization 212. The first and second storage magnetization 231, 232 is then switched in accordance to a net magnetic stray field corresponding to the sum of the first magnetic stray field 60 and second local magnetic stray field 61.

The first and second free magnetizations 211, 212, and thus the magnitude of the first and second local magnetic stray fields 60, 61 can be varied by varying the thickness of the first and second free layers 21, 22. In an embodiment, the thickness of the first and second sense layers 21, 22 is such that each of the first and second free magnetizations 211, 212 is greater than the sum of the first and second storage magnetizations 231, 232. Preferably, the thickness of the sense layer 21 is such that the magnitude of the write magnetic field 52 required for saturating the free magnetizations 211, 212 can be below about 80 Oe. The magnitude of the local magnetic stray field 60, 61 can be further increased by providing the sense layer 21, 24 with a material that exhibits large spontaneous magnetization. Moreover, the magnitude of the write magnetic field 52 required for saturating the free magnetizations 211, 212 can be further reduced by providing the sense layer 21, 22 with a small anisotropy.

Since the distance between the first storage layer 23 and the first sense layer 21, and between the second storage layer 24 and the second sense layer 22 is small, typically in the nanometer range, the first and second storage magnetizations 231, 232 are more effectively coupled with the first and second free magnetizations 211, 212 than with the write magnetic field 52 generated by the field line 5 (or current line 4).

In another embodiment, a self-referenced method for reading the MRAM element 1 comprises:

adjusting the first and second sense magnetizations 211, 212 in a first read direction;

measuring a first junction resistance value $R_1$;

adjusting the first and second sense magnetizations 211, 212 in a second read direction; and measuring a second junction resistance value $R_2$.

In an embodiment, adjusting the first and second sense magnetizations 211, 212 in the first read direction comprises applying a read magnetic field 54 having a first direction by passing a read field current 53 with a first polarity in the field line 5. Adjusting the first and second sense magnetizations 211, 212 in the second read direction comprises applying the read magnetic field 54 having a second direction by passing the read current 53 with a second polarity in the field line 5. The first and second sense layers 21, 22 are configured such as to have a magnetic anisotropy being oriented in a direction being substantially perpendicular with the field line 5 such that the first and second sense magnetizations 211, 212 become adjusted substantially simultaneously and substantially in the same first and second direction when applying the read magnetic field 54 in the first and second direction, respectively. Measuring the first and second junction resistance values $R_1$, $R_2$ can be performed by passing a sense current 32 in the magnetic tunnel junction 2 via the current line 4.

The MRAM element 1 is being further configured such that the first portion 2' of the magnetic tunnel junction 2 has a first resistance-area product $RA_1$ that is substantially equal to a second resistance-area product $RA_2$ of the second portion 2" of the magnetic tunnel junction 2. Since during the write operation, the first storage magnetization 231 is switched in a direction substantially parallel to the second storage magnetization 232, the magnetoresistance ratio MR of the MRAM element 1 remains substantially unchanged by the write operation. Here the magnetoresistance ratio MR is defined as:

$$MR=(R_2-R_1)/R_1 \quad \text{(Equation 1)}$$

where $R_1$ is a low resistance of the magnetic tunnel junction 2 measured when the first and second sense magnetizations 211, 212 are adjusted substantially parallel to the first and second storage magnetizations 231, 232, and $R_2$ is a high resistance of the magnetic tunnel junction 2 measured when the first and second sense magnetizations 211, 212 are adjusted substantially antiparallel to the first and second storage magnetizations 231, 232.

In an embodiment, the first and second tunnel barrier layers 25, 26 comprise $Al_2O_3$ or MgO. The first and second tunnel barrier layers 25, 26 may have substantially the same thickness. The first and second sense layers 21, 22 can also have substantially the same thickness.

REFERENCE NUMBERS 1 magnetic random access memory cell
2 magnetic tunnel junction
2' first portion
2" second portion
20 antiferromagnetic layer
21 first sense layer
22 second sense layer
23 first storage layer
24 second storage layer
25 first tunnel barrier layer
26 second tunnel barrier layer
211 first free magnetization
212 second free magnetization
231 first ferromagnetic layer
232 second ferromagnetic layer
24 first antiferromagnetic layer
31 heating current
32 read current
4 current line
5 field line
51 write current
52 write magnetic field
53 read field current
54 read magnetic field
60 first local magnetic stray field
61 second local magnetic stray field
MR magnetoresistance ratio
$R_1$ low resistance
$R_2$ high resistance
$RA_1$ first resistance-area product
$RA_2$ second resistance-area product

The invention claimed is:

1. Magnetic random access memory (MRAM) element suitable for a thermally-assisted write operation and for a self-referenced read operation and having a magnetoresistance ratio, the MRAM element comprising a magnetic tunnel junction portion having a first portion comprising:
a first storage layer having a first storage magnetization;
a first sense layer having a first free magnetization; and
a first tunnel barrier layer between the first storage layer and the first sense layer;
and a second portion, comprising:
a second storage layer having a second storage magnetization;
a second sense layer having a second free magnetization; and
a second tunnel barrier layer between the second storage layer and the second sense layer;
the magnetic tunnel junction portion further comprising an antiferromagnetic layer comprised between the first and second storage layers and pinning the first and second storage magnetizations at a low temperature threshold, and freeing the first and second storage magnetizations at a high temperature threshold;
wherein during a write operation, the first and second free magnetization are magnetically saturable according to a direction of a write magnetic field when the write magnetic field is applied; and
the first and second storage magnetization are switchable in a direction substantially parallel and corresponding to the direction of the saturated first and second free magnetizations.

2. MRAM element according to claim 1,
being further configured such that during a read operation the first and second free magnetizations are adjusted substantially simultaneously and in a direction substantially parallel.

3. MRAM element according to claim 1,
being further configured such that the first magnetic tunnel junction portion has a first resistance-area product that is substantially equal to a second resistance-area product of the second magnetic tunnel junction portion, such that a magnetoresistance ratio of the MRAM element remains substantially unchanged during the write operation.

4. MRAM element according to claim 1, wherein
the first and second tunnel barrier layers comprise $Al_2O_3$ or MgO.

5. MRAM element according to claim 1, wherein
the first and second tunnel barrier layers have substantially the same thickness.

6. A method for writing to a MRAM element having a magnetoresistance ratio and comprising a magnetic tunnel junction portion having a first portion comprising: a first storage layer having a first storage magnetization; a first sense layer having a first free magnetization; and a first tunnel barrier layer between the first storage layer and the first sense layer; and a second portion, comprising: a second storage layer having a second storage magnetization; a second sense layer having a second free magnetization; and a second tunnel barrier layer between the second storage layer and the second sense layer;
the magnetic tunnel junction portion further comprising an antiferromagnetic layer comprised between the first and second storage layers and pinning the first and second storage magnetizations at a low temperature threshold, and freeing the first and second storage magnetizations at a high temperature threshold;
wherein during a write operation, the first and second free magnetization are magnetically saturable according to a direction of a write magnetic field when the write magnetic field is applied; and
the first and second storage magnetization are switchable in a direction substantially parallel and corresponding to the direction of the saturated first and second free magnetizations; the method comprising:
heating the MRAM element at the high temperature threshold;
switching the first and second storage magnetizations; and
cooling the MRAM element at the low temperature threshold such as to freeze the first and second storage magnetizations in their written state;

said switching comprising applying a write magnetic field such as to magnetically saturate the first and second free magnetization according to a direction of the write magnetic field; and the first and second storage magnetizations being switched substantially simultaneously in a direction substantially parallel to each other.

7. Method for writing according to claim 6, wherein the MRAM element further comprises a field line in communication with the first and second magnetic tunnel junction portions and wherein said switching first and second storage magnetizations is performed by a magnetic field generated by passing a field current through the field line.

8. A method for reading the MRAM having a magnetoresistance ratio and comprising a magnetic tunnel junction portion having a first portion comprising: a first storage layer having a first storage magnetization; a first sense layer having a first free magnetization; and a first tunnel barrier layer between the first storage layer and the first sense layer; and a second portion, comprising: a second storage layer having a second storage magnetization; a second sense layer having a second free magnetization; and a second tunnel barrier layer between the second storage layer and the second sense layer;

the magnetic tunnel junction portion further comprising an antiferromagnetic layer comprised between the first and second storage layers and pinning the first and second storage magnetizations at a low temperature threshold, and freeing the first and second storage magnetizations at a high temperature threshold;

wherein during a write operation, the first and second free magnetization are magnetically saturable according to a direction of a write magnetic field when the write magnetic field is applied; and the first and second storage magnetization are switchable in a direction substantially parallel and corresponding to the direction of the saturated first and second free magnetizations; the method comprising:

adjusting the first and second free magnetizations in a first read direction;

measuring a first junction resistance value;

adjusting the first and second free magnetizations in a second read direction; and measuring a second junction resistance value, wherein said adjusting the first and second free magnetizations is performed simultaneously.

9. Method for reading according to claim 8, wherein the MRAM element further comprises a field line in communication with the first and second magnetic tunnel junction portions and said adjusting the first and second free magnetizations in a first read direction and in a second direction comprising applying a read magnetic field by passing a read current in the field line, the read magnetic field having a first direction and a second direction opposed to the first direction, respectively.

* * * * *